United States Patent
Singer et al.

(10) Patent No.: US 10,886,704 B2
(45) Date of Patent: *Jan. 5, 2021

(54) SEMICONDUCTOR LASER AND METHOD FOR PRODUCING A SEMICONDUCTOR LASER

(71) Applicant: OSRAM OLED GMBH, Regensburg (DE)

(72) Inventors: Frank Singer, Regenstauf (DE); Norwin Von Malm, Nittendorf (DE); Tilman Ruegheimer, Regensburg (DE); Thomas Kippes, Neumarkt (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/711,186

(22) Filed: Dec. 11, 2019

(65) Prior Publication Data
US 2020/0144794 A1  May 7, 2020

Related U.S. Application Data

(63) Continuation of application No. 15/765,997, filed as application No. PCT/EP2016/073352 on Sep. 29, 2016, now Pat. No. 10,554,019.

(30) Foreign Application Priority Data

Oct. 6, 2015  (DE) .......................... 10 2015 116 970

(51) Int. Cl.
*H01S 5/227* (2006.01)
*H01S 5/02* (2006.01)
(Continued)

(52) U.S. Cl.
CPC .............. *H01S 5/227* (2013.01); *H01L 24/19* (2013.01); *H01S 5/0201* (2013.01);
(Continued)

(58) Field of Classification Search
CPC ...... H01S 5/227; H01S 5/0224; H01S 5/0422; H01S 5/0201; H01S 5/0425;
(Continued)

(56) References Cited

U.S. PATENT DOCUMENTS 10,554,019 B2 * 2/2020 Singer ..................... H01S 5/227
2001/0019569 A1 * 9/2001 Jayararnan .......... H01S 5/18338
372/50.1

(Continued)

FOREIGN PATENT DOCUMENTS

CN  102097746 A  6/2011
DE  102012209264 A1  12/2013
(Continued)

OTHER PUBLICATIONS

OSRAM PLPM4 450 broschre-multi-die-laserpackage-gb www.osram-os.com Accessed Mar. 5, 2018.
(Continued)

*Primary Examiner* — Xinning(Tom) Niu
(74) *Attorney, Agent, or Firm* — MH2 Technology Law Group LLP

(57) ABSTRACT

In one embodiment of the invention, the semiconductor laser (1) comprises a semiconductor layer sequence (2). The semiconductor layer sequence (2) contains an n-type region (23), a p-type region (21) and an active zone (22) lying between the two. A laser beam is produced in a resonator path (3). The resonator path (3) is aligned parallel to the active zone (22). In addition, the semiconductor laser (1) contains an electrical p-contact (41) and an electrical n-contact (43) each of which is located on the associated region (Continued)

(21, 23) of the semiconductor layer sequence (2) and is configured to input current directly into the associated region (21, 23). The n-contact (43) extends from the p-type region (21) through the active zone (22) and into the n-type region (23) and is located, when viewed from above, next to the resonator path (3).

16 Claims, 6 Drawing Sheets

(51) Int. Cl.

| | | |
|---|---|---|
| *H01S 5/022* | (2006.01) | |
| *H01S 5/042* | (2006.01) | |
| *H01L 23/00* | (2006.01) | |
| H01S 5/024 | (2006.01) | |
| H01S 5/323 | (2006.01) | |
| H01S 5/22 | (2006.01) | |
| H01L 21/56 | (2006.01) | |

(52) U.S. Cl.
CPC .......... *H01S 5/0224* (2013.01); *H01S 5/0422* (2013.01); *H01L 21/568* (2013.01); *H01L 2224/04105* (2013.01); *H01L 2924/18162* (2013.01); *H01S 5/02228* (2013.01); *H01S 5/02461* (2013.01); *H01S 5/02469* (2013.01); *H01S 5/0425* (2013.01); *H01S 5/04257* (2019.08); *H01S 5/22* (2013.01); *H01S 5/32341* (2013.01); *H01S 2301/176* (2013.01)

(58) Field of Classification Search
CPC ............. H01S 5/32341; H01S 5/02469; H01S 5/02461; H01S 2301/176; H01S 5/02228; H01S 5/22; H01L 24/19; H01L 2924/18162; H01L 2224/04105; H01L 21/568
See application file for complete search history.

(56) References Cited

U.S. PATENT DOCUMENTS

| | | | |
|---|---|---|---|
| 2001/0030327 A1 | 10/2001 | Furushima | |
| 2003/0161371 A1* | 8/2003 | Althaus | H01S 5/0264 |
| | | | 372/50.21 |
| 2004/0005728 A1* | 1/2004 | Sugahara | H01S 5/32341 |
| | | | 438/46 |
| 2005/0190416 A1 | 9/2005 | Yoneda | |
| 2006/0018358 A1 | 1/2006 | Kadowaki et al. | |
| 2008/0017868 A1 | 1/2008 | Yoneda | |
| 2012/0074441 A1 | 3/2012 | Seo et al. | |
| 2013/0049059 A1 | 2/2013 | Odnoblyudov et al. | |
| 2014/0334512 A1 | 11/2014 | Kwon et al. | |
| 2015/0129901 A1 | 5/2015 | Hoppel et al. | |

FOREIGN PATENT DOCUMENTS

| | | |
|---|---|---|
| DE | 102012106364 A1 | 1/2014 |
| JP | H05-160521 A | 6/1993 |
| JP | 2000058965 A | 2/2000 |
| JP | 2000244012 A | 9/2000 |
| JP | 2001-251018 A | 9/2001 |
| JP | 2003-264334 A | 9/2003 |
| JP | 2005142546 A | 6/2005 |
| JP | 2014522123 A | 8/2014 |
| JP | 2015500567 A | 1/2015 |
| JP | 2015507371 A | 3/2015 |
| JP | 2015514319 A | 5/2015 |
| WO | 2003/063312 A1 | 7/2003 |
| WO | 2015/056489 A1 | 4/2015 |

OTHER PUBLICATIONS

PL TB450B www.osram-os.com Jun. 12, 2013.
Luca Redaelli el al: "INDEX-Antiguiding in Narrow-Ridge GaN-Based Laser Diodes Investigated by Measurements of the Current-Dependent Gain and Index Spectra and by Self-Consistent Simulation", IEEE Journal of Quantum Electronics; Aug. 2015, vol. 51, No. 8.
Notice of Reasons for Rejection dated Mar. 5, 2019, issued in corresponding Japanese Patent Application No. 2018-517166.
Office Action issued in Chinese Application No. 201680058288.5, dated Jul. 2, 2019.
Decision of Rejection received in Japanese Patent Application No. 2018-517166, dated Oct. 8, 2019.
Non-final Office Action received in U.S. Appl. No. 15/765,997, dated Apr. 15, 2019.
Notice of Allowance received in U.S. Appl. No. 15/765,997, dated Sep. 18, 2019.

* cited by examiner

SEMICONDUCTOR LASER AND METHOD FOR PRODUCING A SEMICONDUCTOR LASER

CROSS-REFERENCE OF RELATED APPLICATIONS

This application is a continuation of U.S. application Ser. No. 15/765,997, filed on Apr. 4, 2018, which is the U.S. National Phase under 35 U.S.C. § 371 of International Patent Application No. PCT/EP2016/073352, filed on Sep. 29, 2016, which in turn claims the benefit of German Application No. 10 2015 116 970.3, filed on Oct. 6, 2015, the entire disclosures of which Applications are incorporated by reference herein.

DESCRIPTION

The invention relates to a semiconductor laser. The invention further relates to a method for producing a semiconductor laser.

The aim of the invention is to provide a compact semiconductor laser from which waste heat can be effectively conducted away.

This object is achieved, inter alia, by a semiconductor laser having the features of patent claim 1. Preferred developments are the subject matter of the remaining claims.

According to at least one embodiment, the semiconductor laser comprises a semiconductor layer sequence. The semiconductor layer sequence is preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$, wherein in each case $0 \leq n \leq 1$, $0 \leq m \leq 1$ and $n+m \leq 1$. The semiconductor layer sequence can have dopants and additional constituents. For the sake of simplicity, however, only the essential components of the crystal lattice of the semiconductor layer sequence are listed, that is Al, As, Ga, In, N or P, even if these can be partially replaced and/or supplemented by small quantities of other substances.

According to at least one embodiment, the semiconductor layer sequence comprises an n-conducting region and a p-conducting region. An active zone is located between these two regions. Along a growth direction of the semiconductor layer sequence, the p-conducting region, the active zone and the n-conducting region are preferably arranged stacked directly on top of one another.

According to at least one embodiment, the semiconductor laser has one or more resonator paths. In the at least one resonator path, a laser radiation is generated during normal operation of the semiconductor laser. The laser radiation generated in the resonator path is emitted at least partially out of the semiconductor laser. Laser radiation means, for example, that the radiation emitted by the semiconductor laser is a coherent radiation. A coherence length of the emitted radiation is, for example, at least 1 mm or 10 mm or 1 m.

According to at least one embodiment, the semiconductor laser comprises an electric p-contact, which is preferably located directly on the p-conducting region and which is designed for impressing current directly into the p-conducting region. In other words, the p-conducting region is energized by the p-contact. In particular, current is impressed in the p-conducting region exclusively via the electrical p-contact.

According to at least one embodiment, the semiconductor laser comprises an electric n-contact. The n-contact is preferably located directly on the n-conducting region in places. In the same manner as the p-contact, the n-contact is designed for impressing current directly into the n-conducting region. During operation of the semiconductor laser, current is impressed into the n-conducting region preferably exclusively via the n-contact.

According to at least one embodiment, the n-contact extends from the p-conducting region and through the active zone into the n-conducting region. In other words, the n-contact is a plated-through hole, also referred to as a via, through the active zone. In this case, the n-contact can also be composed of a plurality of plated-through holes or vias.

According to at least one embodiment, the n-conducting region is designed for current conduction and/or current spreading in the direction parallel to the active zone. A current flow then takes place from the n-contact via the n-conducting region, wherein a main current flow direction in the n-conducting region is preferably oriented perpendicular to a main current direction in the n-contact. The active zone is supplied with current running from the n-conducting region to the p-conducting region and towards the p-contact, wherein here a current direction is preferably oriented antiparallel to a main current direction in the n-contact.

According to at least one embodiment, viewed in plan view in particular on the p-conducting region, the at least one resonator path is located beside the electrical n-contact, at least within the semiconductor layer sequence. This can mean that the resonator path and the n-contact do not intersect and do not touch each other in a plane of the active zone. In particular, the laser radiation guided in the resonator path does not or not significantly reach the n-contact.

In at least one embodiment, the semiconductor laser comprises a semiconductor layer sequence. The semiconductor layer sequence comprises an n-conducting region, a p-conducting region and an active zone lying between said regions. In at least one resonator path, a laser radiation is generated during operation of the semiconductor laser. The resonator path is oriented parallel to the active zone and can lie in the active zone. The semiconductor laser further comprises an electric p-contact and an electric n-contact, which are located on the associated region of the semiconductor layer sequence and which are designed to impress current directly in the associated region of the semiconductor layer sequence. The n-contact extends from the p-conducting region through the active zone into the n-conducting region and, viewed in a plan view, is located next to the resonator path.

Laser diodes are usually offered for so-called consumer applications in TO housings or on intermediate carriers such as ceramic carriers. However, these types of mounting for laser diodes are technically comparatively complicated and relatively expensive.

In particular in TO housings, a semiconductor laser chip is mounted on a metallic housing base, for instance by means of soldering, and is electrically contacted via bonding wires. The TO housing is closed with a metallic cap and with an optical window, for instance made of glass. An external electrical contacting of such a TO housing is carried out by means of electrical contact pins, which pass through a printed circuit board and are then electrically and mechanically fastened by soldering. In such TO housings, an achievable thermal resistance for heat dissipation away from the semiconductor laser chip is comparatively high and is in the order of magnitude of 15 K/W. From this comparatively large thermal resistance, restrictions with regard to a maximum operating current of the semiconductor laser chip result. An increased thermal resistance also occurs when intermediate carriers are used.

The semiconductor laser described here can, on the one hand, be produced cost-effectively and be used in a simple manner for a customer, since a surface mounting, also referred to as SMT, is possible. On the other hand, such a semiconductor laser has a low thermal resistance towards an external heat sink. Furthermore, intermediate carriers can be dispensed with in the semiconductor laser described here.

According to at least one embodiment, in the direction perpendicular to the active zone, a thermal resistance from the resonator path to electrical contact surfaces on the p-conducting region for the external electrical contact of the semiconductor laser is reduced by the n-contact, and the n-contact is spaced apart from the resonator path to such an extent that the resonator path is optically unaffected by the n-contact.

The reduction in thermal resistance is in particular achieved in comparison with a semiconductor layer sequence in which no recess for the n-contact is formed and which is free of a metallic component extending through the active zone, such as, for example, the n-contact. The reduced thermal resistance can be achieved in particular as a result of the n-contact, which is formed from a thermally conductive metal and which can thus have a considerably greater thermal conductivity than a material of the semiconductor layer sequence itself.

A distance between the n-contact and the resonator path is determined in particular in a plane parallel to the active zone or in the plane of the active zone. The distance between the resonator path and the n-contact can, for example, be at least 2 µm or 5 µm or 10 µm or 25 µm. Alternatively or additionally, this distance is at most 250 µm or 150 µm or 80 µm or 50 µm. The distance between the n-contact and the resonator path is advantageously selected in such a way that a particularly efficient dissipation of heat in the direction away from the resonator path can be achieved. On the other hand, the distance is selected to be large enough to ensure that the resonator path is optically unaffected by the n-contact.

According to at least one embodiment, the semiconductor laser can be surface-mounted. This means that the semiconductor laser can be mounted on an external carrier by means of SMT (surface mount technology). It is not necessary for parts of the semiconductor laser to penetrate the external carrier or to be embedded in the external carrier. In this way, comparatively large external contact surfaces can be achieved, by means of which efficient heat dissipation is also enabled. For example, a thermal resistance between the active zone and the external carrier is at a maximum of 5 K/W or 2 K/W or 1 K/W in the intended use.

According to at least one embodiment, the n-contact, in at least one cross section parallel to the active zone, is surrounded all around by a material of the semiconductor layer sequence. In particular, in the region of the p-conducting region and in the plane of the active zone, the n-contact is surrounded all around by a closed path of the associated semiconductor material. In other words, the n-contact is not exposed anywhere in the lateral direction in the region of the semiconductor layer sequence.

As an alternative to this, it is possible for the n-contact to be attached to an edge of the semiconductor layer sequence and to be laterally exposed or not to be covered laterally by a material of the semiconductor layer sequence. In this case, however, it is preferred, when viewed in a plan view, that the n-contact is completely covered by the n-conducting region.

According to at least one embodiment, the n-contact and/or the p-contact consist of one or more metals. In this case, the n-contact and the p-contact can partially or entirely consist of the same metals. For example, the n-contact and/or the p-contact comprise one or more of the following metals or consist of one or more of these metals: silver, gold, platinum, palladium, tungsten, nickel, titanium, rhodium.

According to at least one embodiment, the n-contact ends within the n-conducting region. In other words, in the direction perpendicular to the active zone, the n-contact then passes through the n-conducting region only partly. For example, the n-contact penetrates from the p-conducting region only at most 20% or 50% into the n-conducting region, relative to a thickness of the n-conducting region.

According to at least one embodiment, the semiconductor laser comprises a ridge waveguide, also referred to as a stripe. In other words, the semiconductor laser is a stripe laser, also referred to as a ridge laser. The resonator path is defined by the ridge waveguide. In particular, the ridge waveguide and the resonator path, viewed in a plan view, are congruent or predominantly congruent. A current impression from the p-contact into the semiconductor layer sequence is preferably restricted to the ridge waveguide or to a part of the ridge waveguide.

According to at least one embodiment, the ridge waveguide is delimited on both sides by trenches in the semiconductor layer sequence. In other words, the ridge waveguide is formed by etching the semiconductor layer sequence, in particular exclusively out of the p-conducting region. In this case, the trenches do not reach as far as the active zone. Apart from the trenches, the semiconductor layer sequence can have a constant, uniform thickness.

According to at least one embodiment, the trenches are at least partially filled with the p-contact. In other words, the metallic material of the p-contact is located in the trenches. The p-contact is preferably not restricted to the trenches.

According to at least one embodiment, the p-contact and the n-contact do not overlap, viewed in a plan view of the p-conducting region. In other words, the p-contact and the n-contact are arranged next to one another and/or arranged without overlapping one another.

According to at least one embodiment, the resonator path is arranged within the active zone. A light amplification is then restricted to the active zone.

According to at least one embodiment, the resonator path runs perpendicular to mutually opposite facets of the semiconductor layer sequence. The facets are lateral boundary surfaces of the semiconductor layer sequence. A degree of reflection of resonator end faces can be adjusted by means of the facets themselves and/or by means of optically effective coatings on the facets.

According to at least one embodiment, a growth substrate for the semiconductor layer sequence is still present in the semiconductor laser. Whether it is a growth substrate for the semiconductor layer sequence can be determined, for example, on the basis of transmission electron microscopy by observing dislocation lines or crystal defects proceeding from the growth substrate. Such defects, which continue from the growth substrate into the semiconductor layer sequence, form a type of fingerprint, with which the affiliation of the semiconductor layer sequence with the growth substrate can be clearly determined.

According to at least one embodiment, the n-contact, viewed in a plan view of the p-conducting region, is formed symmetrically. In this case, the resonator path preferably represents an axis of symmetry. In other words, the n-contact is then formed identically, for example within the scope of manufacturing tolerances, on both sides of the resonator path.

According to at least one embodiment, the n-contact or at least one sub-area of the n-contact is located close to the resonator path. This can mean that a distance between the resonator path and the n-contact is at least 2 µm or 5 µm or 10 µm or 25 µm. Alternatively or additionally, this distance is at most 250 µm or 150 µm or 80 µm or 50 µm. The distance is determined in particular in a plane parallel to the active zone or in the plane of the active zone. A particularly efficient dissipation of heat in the direction away from the resonator path can be achieved by such a small distance between the n-contact and the resonator path.

According to at least one embodiment, within the semiconductor layer sequence the n-contact is surrounded in places or, preferably, all around by an electrical isolation, in the direction parallel to the active zone. This means, for example, that the electrical isolation is located between the resonator path and the n-contact. The electrical isolation can be mounted directly on the, in particular, metallic n-contact. By means of such an insulation it can be ensured, in the plane of the active zone, that no current flow from the n-contact into or towards the resonator path takes place.

According to at least one embodiment, in particular in the direction perpendicular to the active zone, a thermal resistance from the resonator path to electrical contact surfaces for external electrical contacting of the semiconductor laser is reduced by means of the n-contact, for example by at least 10% or 20% or 40%. This applies in particular in comparison to a semiconductor layer sequence in which no recess is formed for the n-contact and which is free from a metallic component running through the active zone as the n-contact. The reduced thermal resistance can be achieved in particular as a result of the n-contact that is formed from a thermally conductive metal and can thus have a considerably greater thermal conductivity than a material of the semiconductor layer sequence itself.

According to at least one embodiment, the n-contact has a comparatively large area, relative to the semiconductor layer sequence. In this case, a cross-sectional area of the semiconductor layer sequence and of the n-contact in the plane of the active zone is preferably used as the reference point. For example, an area proportion of the n-contact, relative to a total area of the semiconductor layer sequence, is at least 5% or 10% or 20% or 30%. Alternatively or additionally, this area proportion is at most 50% or 30% or 10%.

According to at least one embodiment, only one, some or all of the electrical contact surfaces for external electrical contacting of the semiconductor laser are located on that side of the active zone on which the p-conducting region is also located. In this way, an external electrical and also thermal contacting by surface mounting, which is in particular free of bonding wires, is made possible. Alternatively, only one or some or all of the electrical contact surfaces for the external electrical contacting of the semiconductor laser are located on that side of the active zone on which the n-conducting region is located, too.

According to at least one embodiment, all facets of the semiconductor layer sequence and/or a top side of the semiconductor layer sequence facing away from the p-conducting region are free of metallizations. In other words, apart from the side on which the external electrical contact surfaces are located, that is to say on the side of the p-conducting region, all remaining surfaces of the semiconductor layer sequence can be free of metallizations. In particular, no electric lines for energizing the semiconductor laser are located on the facets and on the top side.

According to at least one embodiment, the semiconductor laser comprises one or more reinforcing layers. Mechanical stabilization of the semiconductor laser can be achieved by means of the reinforcing layers. Alternatively or additionally, the reinforcing layers can serve for heat spreading. Particularly preferably, the at least one reinforcing layer is a metal layer which consists of one or more metals. For example, the at least one reinforcing layer is produced by an electroplating process. The reinforcing layer is preferably located on the same side of the active zone as the p-conducting region.

According to at least one embodiment, one metallic reinforcing layer each is located directly on the n-contact and directly on the p-contact. In this case, the reinforcing layers lie on the sides of the two contacts which are remote from the semiconductor layer sequence. The reinforcing layers could laterally project beyond the semiconductor layer sequence, terminate flush with the semiconductor layer sequence or can be set back relative to edges of the semiconductor layer sequence, seen in plan view.

According to at least one embodiment, the at least one metallic reinforcing layer is located close to the semiconductor layer sequence. This can mean that an average distance between the reinforcing layer and the semiconductor layer sequence is at least 0.2 µm or 0.3 µm or 0.6 µm. Alternatively or additionally, this distance is at most 5 µm or 3 µm or 1.5 µm. In particular, only a material of the n-contact and/or of the p-contact is present between the semiconductor layer sequence and the reinforcing layer, and also a material of an electrical insulating layer for locally insulating the semiconductor layer sequence from the p-contact.

According to at least one embodiment, the reinforcing layer(s) is (are) covered on a side facing away from the semiconductor layer sequence only in places by at least one electrical insulation layer. In particular, only exactly one region of each of the reinforcing layer for the n-contact and the reinforcing layer for the p-contact is left free by the electrical insulation layer.

According to at least one embodiment, the electrical insulation layer is covered by at least two metallic electrical contact surfaces. The electrical contact surfaces are provided for external electrical and preferably also thermal contacting of the semiconductor laser. The contact surfaces are located in particular directly on the insulation layer and adjoin the reinforcing layers directly in places. A current flow to the n-contact and to the p-contact thus takes place, on the one hand, via the electrical contact surfaces and, on the other hand, via the reinforcing layers.

According to at least one embodiment, the electrical contact surfaces have a different base area than the reinforcing layers. Likewise, a base area of the contact areas can be different from base areas of the n-contact and of the p-contact. This applies in particular in a plan view of the p-conducting region.

According to at least one embodiment, the electrical contact surfaces for external electrical contacting project laterally beyond the semiconductor layer sequence, that is to say in the direction parallel to the active zone and in particular in a plan view of the p-conducting region. A surface area of the electrical contact surfaces can be greater than a surface area of the semiconductor layer sequence, seen in plan view.

Alternatively, it is possible for the external electrical contact surfaces to be completely covered by the semiconductor layer sequence, seen in plan view. In particular, the electrical contact surfaces are then set back relative to the facets of the semiconductor layer sequence so that an outer edge of the semiconductor layer sequence, seen in plan view, is free of the contact surfaces.

According to at least one embodiment, the electrical contact surfaces are oriented parallel to the active zone. In other words, a mounting plane for the semiconductor laser is arranged parallel to the active zone. In this case, the laser radiation is emitted preferably in the direction parallel to the electrical contact surfaces and parallel to a mounting platform for the semiconductor laser.

According to at least one embodiment, seen in a plan view of the p-conducting region, the n-contact is formed by one or more partial regions separated from one another, which are round or circular in plan view. Proceeding from said partial regions, the n-contact can extend in a column-like manner through the active zone into the n-conducting region.

As an alternative to such round sub-regions seen in plan view, the n-contact can also be formed as a strip. The one or more strips through which the n-contact is formed, as seen in plan view, preferably extend parallel along the resonator path. In this case, the strips can extend completely or only partly along the resonator path, for example over a length of at least 20% or 40% or 60% of the length of the resonator path or over at most 95% or 80% or 60% of the length of the resonator path.

According to at least one embodiment, the semiconductor laser comprises a casting body. Viewed in a plan view, the casting body surrounds the semiconductor layer sequence preferably all around and/or in a closed path. The semiconductor layer sequence can be mechanically fixedly connected to the casting body.

According to at least one embodiment, the casting body is formed from at least one plastic. Preferably, the plastic is a light-transmissive, transparent plastic such as an acrylate or a polycarbonate or an epoxide or a silicone. In particular, the plastic is designed to be irradiated by the laser radiation. However, it is preferably possible for the casting body not to be present in the region of a light exit surface of the semiconductor layer sequence, so that the laser radiation can exit from the semiconductor laser without having to be guided through the casting body.

According to at least one embodiment, a thickness of the casting body is equal to a thickness of the semiconductor layer sequence or a thickness of the semiconductor layer sequence together with the growth substrate. This applies in particular with a tolerance of at most 5 µm or 3 µm or 1.5 µm. In this case, boundary surfaces of the casting body are preferably exclusively parallel and perpendicular to the active zone. In other words, the casting body can be a cuboid, wherein preferably a boundary surface of the semiconductor layer sequence, in particular the top side thereof, lies in one side of said cuboid.

According to at least one embodiment, the semiconductor laser has lateral dimensions, that is to say dimensions in the direction parallel to the active zone, which amount to at most three times or twice or 1.4 times the corresponding dimensions of the semiconductor layer sequence. In other words, the semiconductor laser can have a housing which is substantially predetermined by the size of the semiconductor layer sequence. Such a housing construction is also referred to as a CSP or chip-size package. Alternatively, it is possible for the semiconductor laser to be free of a housing and/or a casting body and that lateral dimensions are specified exclusively by the semiconductor layer sequence. In the latter case, it is possible for the semiconductor laser to consist exclusively of inorganic materials.

The invention further relates to a method for producing a semiconductor laser. By means of the method, in particular a semiconductor laser is produced as specified in connection with one or more of the above-mentioned embodiments. Features of the method are therefore also disclosed for the semiconductor laser and vice versa.

In at least one embodiment, the method comprises at least the following steps, preferably in the specified order:

A) Epitaxially growing the semiconductor layer sequence and producing the p-contacts and the n-contacts preferably still in the wafer composite, B) Singulating the semiconductor layer sequence, for instance by etching or by scoring and breaking to form semiconductor laser chips, and applying the semiconductor laser chips to an intermediate carrier, C) Creating the temporary or permanent casting body, wherein the casting body surrounds the semiconductor laser chips all around, in plan view, and wherein the casting body mechanically connects the semiconductor laser chips to one another mechanically at least at times, D) Producing the reinforcing layers and/or the external electrical contact surfaces, and E) Singulating to form the semiconductor lasers, for example by dividing the enduring, permanent casting body or also by removing the temporary casting body.

The method steps of separating the semiconductor layer sequence into the semiconductor laser chips on the one hand and the application of the semiconductor laser chips to an intermediate carrier on the other hand can also be carried out separately from one another in partial steps which are immediately consecutive or which are not directly consecutive.

In method step B), preferably after singulation into the semiconductor laser chips, the facets are applied in places or over the entire surface with a mirror layer. This can take place before or, less preferably, even after the placing on the intermediate carrier. The resonator path and thus a resonator for the laser radiation can be defined and/or set by the at least one mirror layer. As an alternative to a mirror layer, it is possible for the resonator path to be set by reflection at the facets on the basis of a refractive index jump.

A semiconductor laser described here and a method described here are explained in more detail below with reference to the drawing on the basis of exemplary embodiments. Identical reference signs indicate the same elements in the individual figures. In this case, however, no relationships to scale are illustrated, but rather individual elements can be represented with an exaggerated size in order to afford a better understanding.

BRIEF DESCRIPTION OF THE FIGURES

In FIG. 1A a sectional illustration and in FIG. 1B a plan view of an exemplary embodiment of a semiconductor laser 1 is shown. Furthermore, FIG. 1C illustrates a possible detailed view from FIG. 1A.

Figure 1A:
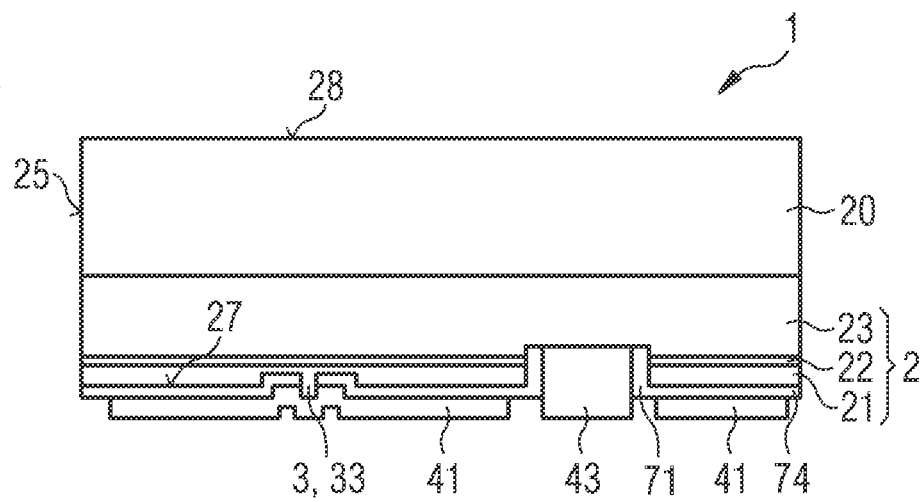
FIGS. 1A to 1C, 4-7, and 8A to 8C show schematic representations of exemplary embodiments of semiconductor lasers described here.

The semiconductor laser 1 has a growth substrate 20, onto which a semiconductor layer sequence 2 is epitaxially grown. The semiconductor layer sequence 2 is preferably based on the material system AlInGaN. The growth substrate 20 is preferably a GaN substrate. The semiconductor layer sequence 2 comprises a p-conducting region 21, an n-conducting region 23 and an active zone 22 which lies between these regions 21, 23. The active zone 22 is preferably a multi-quantum well structure, also referred to as MQW. A thickness of the semiconductor layer sequence 2 is, for example, between 2 µm and 10 µm inclusive. A thickness of the growth substrate 20 is, for example, at least 40 µm and/or at most 400 µm.

During operation, a laser radiation is generated in the active zone 22 in the region of a ridge waveguide 33. The ridge waveguide 33 defines a resonator path 3, which is oriented perpendicular to facets 25 of the semiconductor layer sequence 2. The ridge waveguide 33 is delimited on both sides by trenches 32 and is defined by the trenches 32. The trenches 32 and thus the ridge waveguide 33 are produced, for instance, by etching the p-conducting region 21. The laser radiation has, for example, a wavelength of maximum intensity of at least 360 nm or 400 nm and/or of at most 560 nm or 485 nm. The laser radiation is, in particular, ultraviolet radiation or blue light, for example when the semiconductor layer sequence 2 is based on AlInGaN. If the semiconductor layer sequence 2 is based, for example, on AlGaInP or AlInGaAs, then the emitted laser radiation is preferably red light or infrared radiation.

A width of the ridge waveguide 33 is preferably at least 1.5 µm and/or at most 15 µm. A total width of the semiconductor layer sequence 2, in the direction perpendicular to the resonator path 3, is in particular at least 200 µm and/or at most 1 mm. Along the resonator path 3, an extent of the semiconductor layer sequence 2 is, for example, at least 200 µm and/or at most 3 mm, depending on an optical power of the semiconductor laser 1.

Figure 1B:
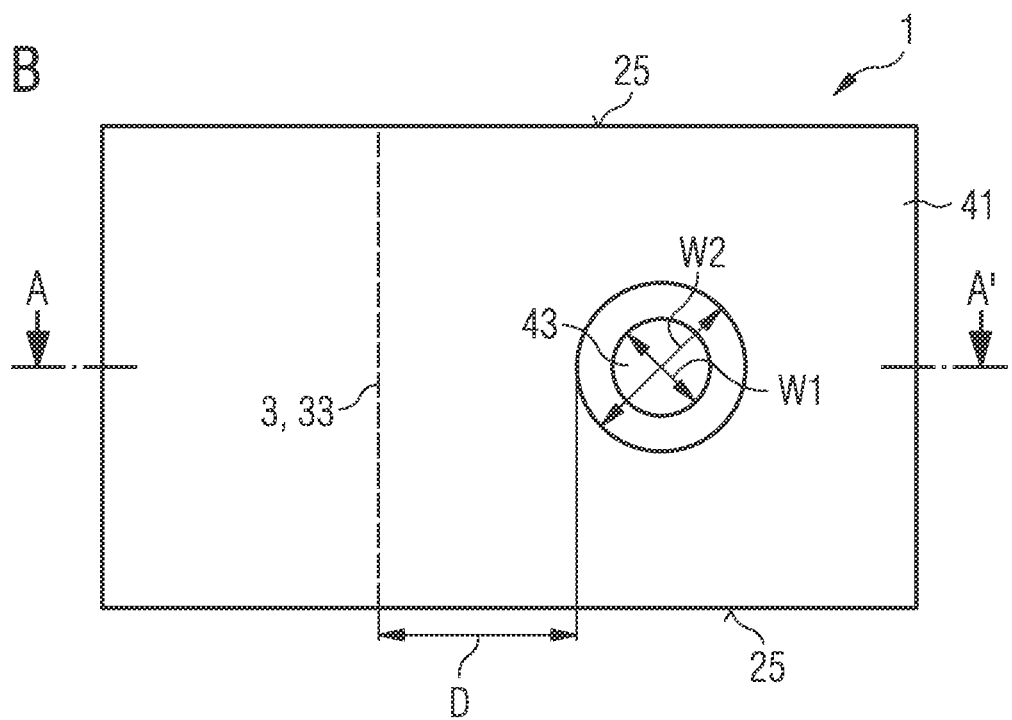
Figure 1C:
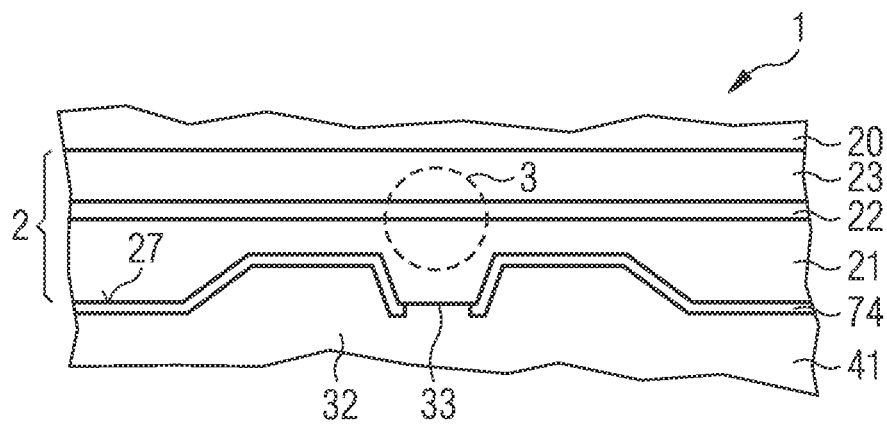

According to FIGS. 1A to 1C, the ridge waveguide 33 is located in the p-conducting region 21, and electrical contacts 41, 43 are likewise located on the side of the p-conducting region 21. As an alternative to this, as well as in all other exemplary embodiments, the ridge waveguide 33 can be located in the n-conducting region 23 and/or one or all of the electrical contacts 41, 43 are located on the side of the n-conducting region 23.

Current impression into the semiconductor layer sequence 2 is done via an electrical p-contact 41 and via an electrical n-contact 43. The contacts 41, 43 are formed by one or more metals. In a plan view of a lower side 27, see FIG. 1B, the contacts 41, 43 do not overlap. A thickness or average thickness of the p-contact 41 is, for example, approximately 2 µm. In the direction away from the active zone 22, the p-contact 41 and the n-contact 43 preferably terminate flush with one another.

The n-contact 43 extends from the p-conducting region 21 through the active zone 22 into the n-conducting region 23 and ends in the latter. Viewed in a plan view, the n-contact 43 is of circular design. A diameter W1 of the n-contact 43 is, for example, at least 5 µm or 10 µm or 20 µm and/or at most 60 µm or 40 µm. In the lateral direction, the n-contact is surrounded all around by an electrical isolation 71. This electrical isolation 71 extends as far as a side of the n-contact 43 facing away from the p-conducting region 21, wherein said side of the n-contact 43 is free of the isolation 71. An outer diameter W2 of the electrical isolation 71 is preferably at most 200 µm or 100 µm or 60 µm and/or at least 40 µm or 60 µm or 120 µm.

Furthermore, viewed in a plan view, the n-contact 43 is spaced apart from the resonator path 3. A distance D between the resonator path 3 and the n-contact 43 is, for example, at least 20 µm and/or at most 200 µm.

A material of the p-contact 41 is applied virtually over the whole area to the lower side 27 of the semiconductor layer sequence 2, wherein the p-contact 41 preferably does not extend entirely as far as the facets 25. However, a current is impressed into the semiconductor layer sequence 2 only in the region of the ridge waveguide 33. In remaining regions, an electrical insulation layer 74 is located between the p-contact 41 and the p-conducting region 21, for example in the same way as the isolation 71 made of silicon dioxide or of silicon nitride.

The insulation layer 74 can extend to a side of the ridge waveguide 33 facing away from the active zone 22 and can partially cover the latter, see FIG. 1C. Alternatively, it is possible that side surfaces of the ridge waveguide 33 are not covered by the insulation layer 74 and that the insulation layer 74 ends on a bottom surface of the trenches 32. As is preferred in all other exemplary embodiments, the trenches 32 do not reach as far as the active zone 22.

FIGS. 2A to 2G show a production method for an exemplary embodiment of a semiconductor laser 1.

In a non-illustrated method step, the semiconductor layer sequence 2 is grown on the growth substrate 20. Subsequently, etching is carried out in order to produce openings for the n-contacts 43. The electrical insulations 71, 74 are then applied and the contacts 41, 43 are produced. A singulation to semiconductor laser chips 10 is thereupon effected. A thickness of the insulation layer 74 is at most 200 nm, for example.

Figure 2A:
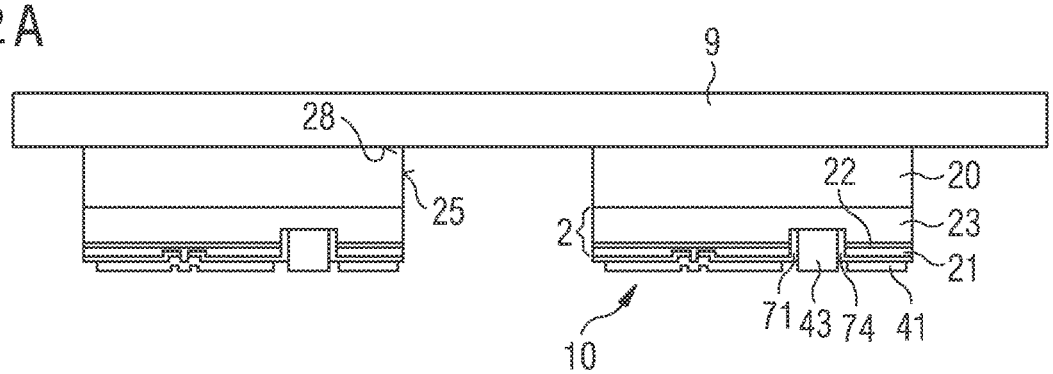
FIGS. 2A to 2G show schematic sectional representations of method steps of a method for producing semiconductor lasers described here.

According to FIG. 2A, said semiconductor laser chips 10 are applied to an intermediate carrier 9. In this case, a distance between adjacent semiconductor laser chips 10 is greater on the intermediate carrier 9 than on the growth substrate 20, as originally grown. The intermediate carrier 9 can be a film, for example a thermally detachable film, or also a rigid intermediate carrier.

Preferably, before the application to the intermediate carrier 9, a mirror layer (not shown) is applied to the facets 25 at least in the region of end faces of the resonator path 3. The quality of a resonator, which defines the resonator path 3, can be adjusted by means of such a mirror layer. It is likewise possible to couple out the laser radiation by means of such a mirror layer on the facets 25. It is possible for such a mirror layer on one facet to have a high reflectivity of, for example, at least 99% and on an opposite side, for coupling out radiation, to have a relatively low reflectivity, for example of at least 50% and/or of at most 80%.

Figure 2B:
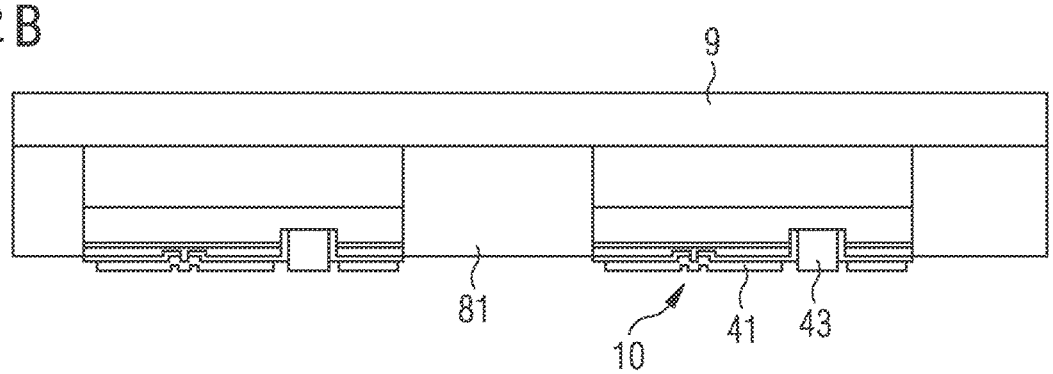

FIG. 2B illustrates that a casting body 81 is produced. In order to produce the casting body 81, a further intermediate carrier (not illustrated) is preferably attached to the contacts 41, 43. The casting body 81 can be formed directly on the semiconductor layer sequence 2 and on the growth substrate 20. Preferably, a thin insulating layer (not shown) is located on the facets 25 of the semiconductor layer sequence 2. Such an insulation layer on the facets 25 has, for example, a thickness of at most 200 nm and thus contributes only insignificantly to a total width of the semiconductor laser chips 10. The casting body 81 is produced from a plastic and mechanically connects the semiconductor laser chips 10 to one another.

The casting body 81 can be transparent and transmissive to the laser radiation generated during operation of the semiconductor laser 1. Alternatively, the casting body 81 can be designed to be absorbent, for example for visible light, at least in places. The casting body 81 can also comprise at least one filler, for example for adapting a coefficient of thermal expansion, for adapting the optical properties and/or for improving a thermal conductivity. For example, the casting body 81 is produced by casting or by means of film-assisted molding.

Figure 2C:
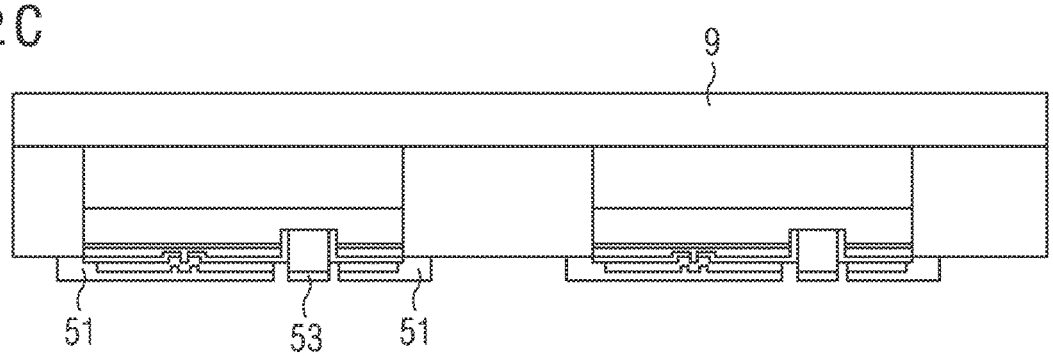

In the method step of FIG. 2C, metallic reinforcing layers 51, 53 are applied, for example galvanically, directly to the contacts 41, 43. The reinforcing layers 51, 53 are formed from nickel, for example. It is possible for the reinforcing layer 51 to project laterally beyond the p-contact 41. The reinforcing layers 51, 53 can thus be larger than the semiconductor layer sequence 2, seen in plan view. In contrast to the illustration, the reinforcing layers 51, 53 can be congruent with the contacts 41, 43 or can be set back relative to the facets 25. An average thickness of the reinforcing layers 51, 53 is preferably at least 0.5 µm or 2 µm and/or at most 15 µm or 8 µm.

Figure 2D:
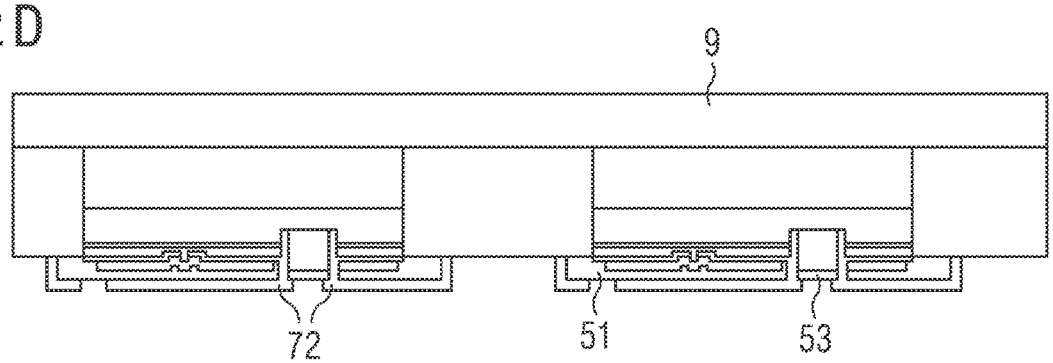

In the method step as shown in FIG. 2D, an electrical insulation layer 72 is applied to the reinforcing layers 51, 53. The reinforcing layers 51, 53 are in each case only exposed in one region and not covered by the insulation layer 72. The insulation layer 72 can be applied in a structured manner or can also be applied over the entire surface with subsequent local removal. The insulation layer 72 is produced, for example, from silicon dioxide or from silicon nitride, in particular with a thickness of at least 50 nm and/or at most 250 nm.

Figure 2E:
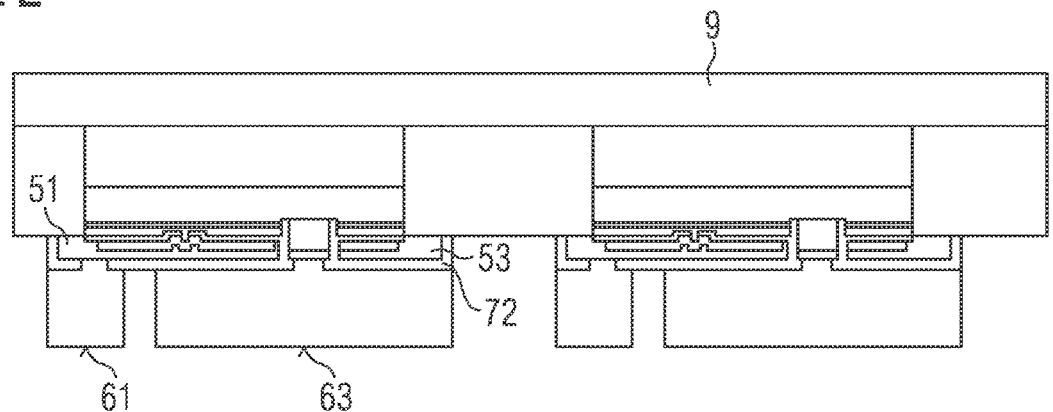

According to FIG. 2E, two external electrical contact surfaces 61, 63 are produced on the reinforcing layers 51, 53 and on the insulation layer 72, for example galvanically or by printing or by means of molding. The contact surfaces 61, 63 contain, for example, gold, copper and/or tin. A thickness of the contact surfaces 61, 63 in the direction perpendicular to the active zone 22 is, for example, at least 1 µm or 10 µm and/or at most 0.5 mm or 0.3 mm or 0.1 mm. By means of a thickness of the contact surfaces 61, 63, a distance of the active zone 22 from an external, not drawn mounting support can be set. The finished semiconductor laser 1 can be electrically and thermally contacted externally via the contact surfaces 61, 63.

Figure 2F:
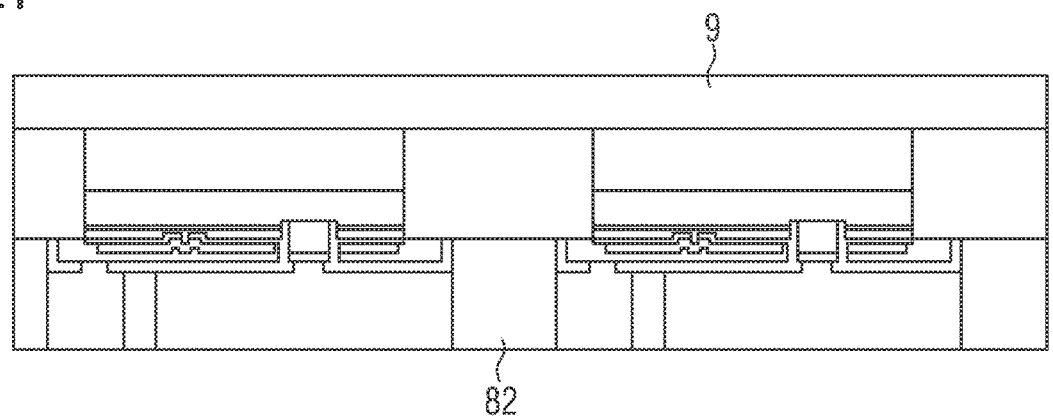

In the optional method step of FIG. 2F, a contact potting 82 is produced, which is located between and preferably directly on the contact surfaces 61, 63. In the direction away from the semiconductor layer sequence 2, the contact potting 82 preferably terminates flush with the contact surfaces 61, 63. In contrast to the illustration, it is also possible for the contact potting 82, as seen in plan view, to surround the contact surfaces 61, 63 only in part, so that the contact surfaces 61, 63 are freely accessible, for example, on outer surfaces.

The contact potting 82 is made, for example, of a plastic such as an epoxy resin or a silicone. In order to adapt the optical properties and, in particular, to adapt a coefficient of thermal expansion, the material for the contact potting 82 can contain admixtures, for instance in the form of particles. The contact potting 82 is produced, for example, by compression molding and subsequent grinding or via film-assisted transfer molding.

The method steps of FIGS. 2E and 2F can also be interchanged. For example, it is possible for the contact potting 82 to be applied in a structured manner with the aid of a photoresist, for example, in such a way that subsequently recesses in the contact potting 82 are filled by the material for the contact surfaces 61, 63.

Figure 2G:
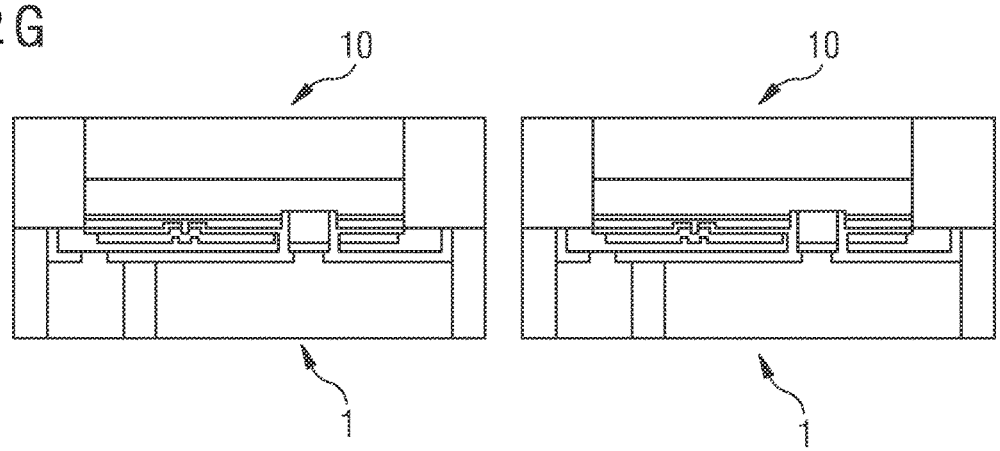

In the final method step of FIG. 2G, singulation to form the finished semiconductor lasers 1 is carried out as well as a removing of the intermediate carrier 9. According to FIG. 2G, the casting body 81 is separated for this purpose, for example by means of sawing, laser treatment or breaking. Alternatively, the casting body 81 can be completely removed in order to achieve the singulation.

According to FIG. 2G, each of the semiconductor lasers 1 has exactly one semiconductor laser chip 10. In contrast to the illustration, it is also possible for a plurality of the semiconductor laser chips 10 to be present in the finished semiconductor lasers 1. The semiconductor laser chips 10 are electrically interconnected in this case, for example via the reinforcing layers 51, 53 or, less preferably, via the external electrical contact surfaces 61, 63. If a plurality of semiconductor laser chips are present, preferably a series circuit is present so that the semiconductor laser 1, as a whole, still has exactly two of the external electrical contact surfaces 61, 63.

Figure 3A:
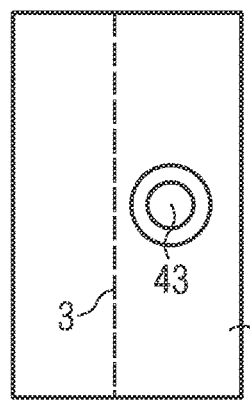
FIGS. 3A to 3E show schematic plan views of p-contacts and of n-contacts for semiconductor lasers described here.

FIGS. 3A to 3E illustrate examples of the configuration of the contacts 41, 43. The example, as shown in FIG. 3A, corresponds substantially to the example of FIG. 1B. However, a longitudinal direction and a transverse direction in FIG. 3A are interchanged with respect to FIG. 1B, so that the resonator path 3 in FIG. 3A extends along the longitudinal axis. The resonator path 3 is located centrally in the semiconductor layer sequence 2 and the n-contact 43 is thus arranged out of the centre.

Figure 3B:
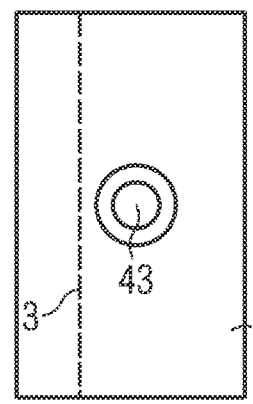

In the exemplary embodiment of FIG. 3B, the n-contact 43 lies centrally in the semiconductor layer sequence 2, seen in plan view. The resonator path 3 is arranged eccentrically.

Figure 3C:
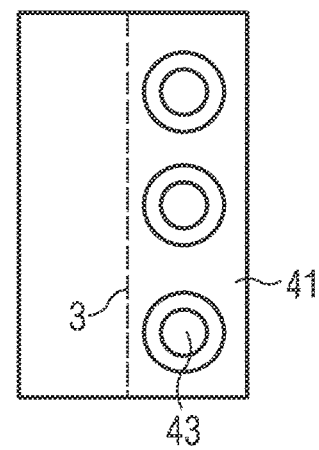

In the exemplary embodiment of FIG. 3C, a plurality of partial regions are present for the n-contact 43, which are arranged along the resonator path 3. Viewed in a plan view, all partial regions for the n-contact are formed identically.

Figure 3D:
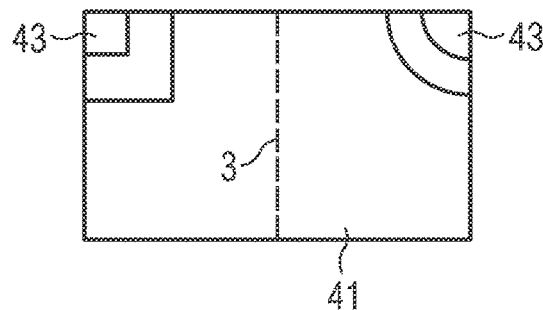

In the exemplary embodiment as shown in FIG. 3D, partial regions for the n-contact 43 are located on both sides of the resonator path 3. This can also be the case in all other exemplary embodiments. The partial areas 43 can be shaped as rectangles or as circular sectors. FIG. 3D illustrates that the partial regions have different shapes, seen in plan view. However, the partial regions 43 are preferably shaped identically.

Figure 3E:
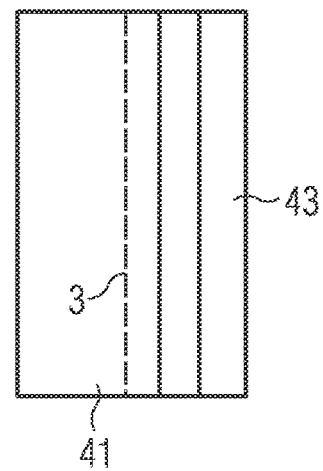

In the exemplary embodiment of FIG. 3E, the n-contact 43 extends in the form of a strip along the entire or almost the entire resonator path 3. As well as in all other exemplary embodiments, however, the n-contact 43 is particularly preferably surrounded all around by a material of the semiconductor layer sequence 2, which is not shown here.

In particular in the exemplary embodiments of FIGS. 3C and 3E it is preferably the case that the electric n-contact 43 is present on both sides and symmetrically with respect to the resonator path 3, other than shown. As a result, uniform current injection into the resonator path 3 is possible and efficient heat dissipation away from the semiconductor layer sequence 2 can also be ensured.

Unlike in FIGS. 3A to 3E, the resonator path 3 can extend not only along a straight line but can also be angled. This is possible, for example, if the semiconductor layer sequence 2 has a facet tilted by 45° in a corner region, on which a mirroring of the laser radiation takes place. Thus, also complicated resonator paths, for example L-shaped or U-shaped resonator paths, can be realized in the semiconductor lasers 1 described here.

Figure 4:
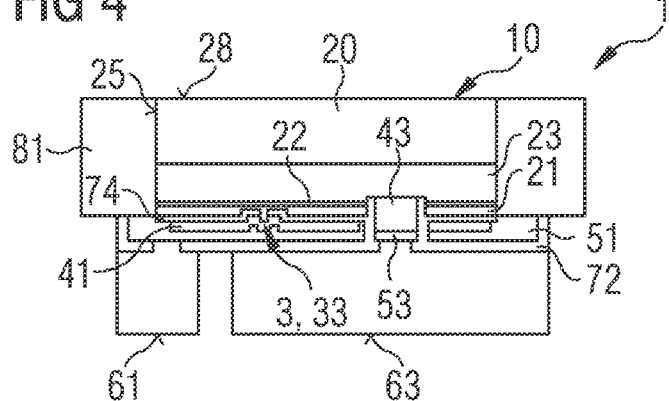

In the above exemplary embodiment of FIG. 2G, the reinforcing layers 51, 53 and the contact surfaces 61, 63 protrude beyond the semiconductor layer sequence 2 and the semiconductor laser chip 10 in a lateral direction. The contact surfaces 61, 63 are set back relative to the casting body 81. In contrast, the optional contact potting 82 in FIG. 4 is not present. In contrast to this, such a contact potting can optionally additionally be applied, as in all other exemplary embodiments.

Figure 5:
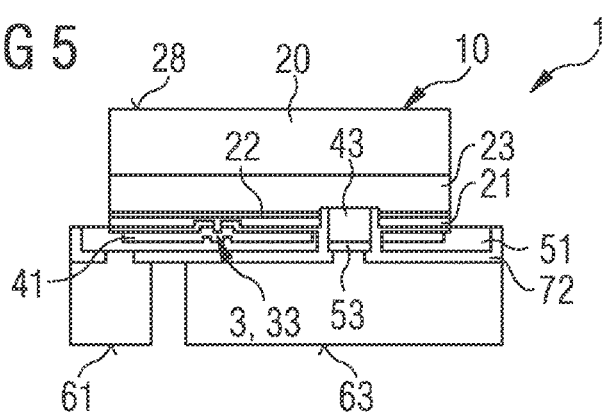

In the exemplary embodiment of FIG. 5, no casting body 81 is present, nor is a contact potting 82. The reinforcing layers 51, 53 project beyond the semiconductor layer sequence 2 and thus the semiconductor laser chip 10 in a lateral direction.

Figure 6:
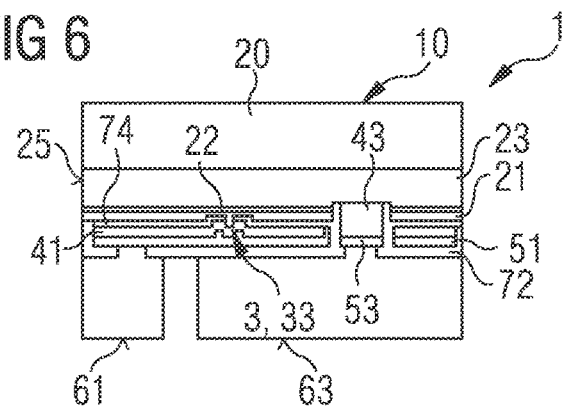

According to FIG. 6, the contact areas 61, 63 terminate flush with the semiconductor layer sequence 2 in the lateral direction. The contacts 41, 43 and the reinforcing layers 51, 53 are set back relative to the facets 25 of the semiconductor layer sequence 2. As a result, an improved separation of the semiconductor layer sequence 2, grown as a whole, into the individual semiconductor laser chips 10 by scoring and breaking can be achieved.

As in all other exemplary embodiments, a distance of the contact surfaces 61, 63 to one another is preferably at least 100 µm or 150 µm and/or at most 400 µm or 200 µm.

Figure 7:
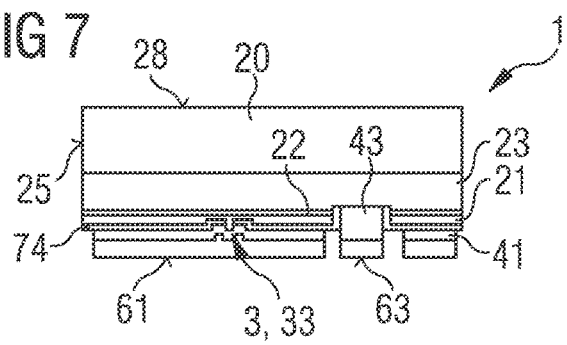

In the exemplary embodiment of FIG. 7, the contact surfaces 61, 63 are located directly on the contacts 41, 43. For example, the contact surfaces 61, 63 are then formed by electroplating from nickel, copper and/or gold. The contact surfaces 61, 63 are, as are the contacts 41, 43, set back relative to the facets 25 of the semiconductor layer sequence 2.

Figure 8A:
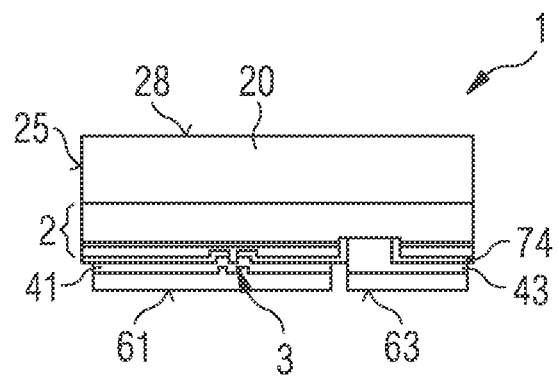
Figure 8B:
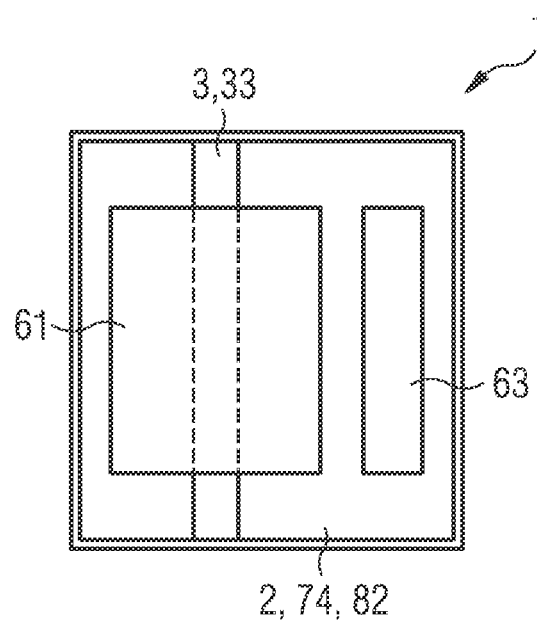

In the exemplary embodiment shown in the sectional illustration in FIG. 8A and the bottom view in FIG. 8B, the contact surfaces 61, 63 are formed, for example, by an AuSn solder, in particular by means of a thin-film solder. As a result, small height tolerances with regard to a position of the active zone 22 relative to the contact surfaces 61, 63 can be ensured.

Figure 8C:
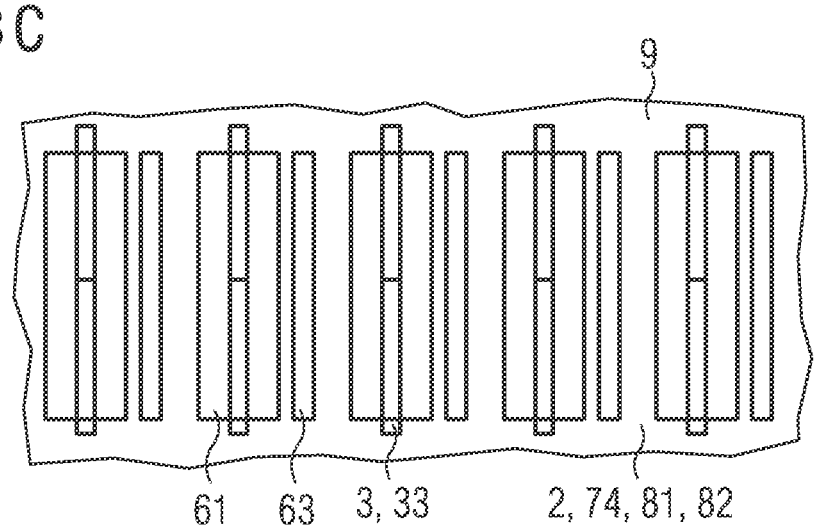

Viewed in a plan view, the contact surfaces 61, 63 are formed as rectangles with different sizes. A representation still in the wafer composite on the intermediate carrier 9 is shown in FIG. 8C. By means of the contact surfaces 61, 63, which are set back from the edge of the semiconductor laser chips 10 to be formed by singulation, a scoring and breaking of the semiconductor layer sequence 2 and optionally a mirror coating of the facets 25 are possible.

The invention described here is not restricted by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

LIST OF REFERENCE SIGNS 1 semiconductor laser
2 semiconductor layer sequence
20 growth substrate
21 p-conducting region
22 active zone
23 n-conducting region
25 facet
27 lower side
28 top side
3 resonator path
32 trench
33 ridge waveguide
41 electric p-contact
43 electric n-contact
51 metallic p-reinforcing layer
53 metallic n-reinforcing layer
61 external electric p-contact surface
63 external electric n-contact surface
71 electrical isolation
72 electrical insulation layer
74 electrical insulation layer
81 casting body
82 contact potting
9 intermediate carrier
10 semiconductor laser chip
D distance resonator path—n-contact
W1 diameter of the n-contact
W2 diameter of the electrical isolation

What is claimed is:

1. A semiconductor laser comprising
a semiconductor layer sequence, which has an n-conducting region, a p-conducting region and an active zone lying therebetween,
at least one resonator path, in which, during operation of the semiconductor laser, a laser radiation is generated and which is oriented parallel to the active zone,
an electric p-contact which is located on the p-conducting region and which is designed for impressing current directly into the p-conducting region, and
an electric n-contact which is located on the n-conducting region and which is designed for impressing current directly into the n-conducting region,
wherein the n-contact extends from the p-conducting region through the active zone into the n-conducting region and, viewed in a plan view, is located beside the resonator path so that the n-contact ends within the n-conducting region,
wherein the n-contact, in at least one cross section parallel to the active zone, is surrounded all around by a material of the semiconductor layer sequence so that in the region of the p-conducting region and in the plane of the active zone, the n-contact is surrounded all around by a closed path of the associated semiconductor material, and
wherein the n-contact and the p-contact each consist of one or more metals.

2. The semiconductor laser according to claim 1,
in which, in the direction perpendicular to the active zone, a thermal resistance from the resonator path towards electrical contact surfaces on the p-conducting region for external electrical contacting of the semiconductor laser is reduced by the n-contact, and the n-contact is separated from the resonator path so far that the resonator path is optically unaffected by the n-contact.

3. The semiconductor laser according to claim 1,
in which the n-contact, in at least one cross section parallel to the active zone, is surrounded all around by a material of the semiconductor layer sequence,
wherein the n-contact and the p-contact each consist of one or more metals, and
wherein the n-contact ends within the n-conducting region.

4. The semiconductor laser according to claim 1,
which comprises a ridge waveguide through which the resonator path is defined,
wherein current is impressed from the p-contact only on the ridge waveguide into the semiconductor layer sequence, and
wherein the ridge waveguide is limited on both sides by trenches in the semiconductor layer sequence and the trenches are at least partially filled with the p-contact.

5. The semiconductor laser according claim 1,
in which the p-contact and the n-contact do not overlap, viewed in a plan view of the p-conducting region,
wherein the resonator path runs within the active zone and runs perpendicular to mutually opposite facets of the semiconductor layer sequence, and
wherein the semiconductor laser comprises a growth substrate for the semiconductor layer sequence.

6. The semiconductor laser according claim 1,
in which the n-contact is of symmetrical shape, seen in a plan view of the p-conducting region, wherein the resonator path is an axis of symmetry.

7. The semiconductor laser according to claim 1,
in which a distance between the n-contact and the resonator path is between 5 µm and 80 µm inclusive, within a plane of the active zone,
wherein, in said plane with the active zone, directly at the n-contact and between the resonator path and the n-contact there is an electrical isolation, so that in said plane no current flow occurs from the n-contact to the resonator path.

8. The semiconductor laser according to claim 1,
in which, in the direction perpendicular to the active zone, a thermal resistance from the resonator path to electrical contact surfaces for external electrical contacting of the semiconductor laser is reduced by at least 20% by means of the n-contact.

9. The semiconductor laser according to claim 1,
in which all electrical contact surfaces for the external electrical contacting of the semiconductor laser are located on that side of the active zone on which the p-conducting region is arranged,
wherein all facets of the semiconductor layer sequence and a top side of the semiconductor layer sequence facing away from the p-conducting region are free of metallizations.

10. The semiconductor laser according to claim 1,
in which directly on the n-contact and directly on the p-contact on sides facing away from the semiconductor layer sequence a metallic reinforcing layer is attached.

11. The semiconductor laser according to claim 9,
in which the electrical contact surfaces laterally protrude from the semiconductor layer sequence, viewed in a plan view of the p-conducting region,
wherein the electrical contact surfaces are aligned parallel to the active zone.

12. The semiconductor laser according to claim 1,
in which the n-contact, in a plan view of the p-conducting region, is formed by a plurality of circular partial regions separated from one another.

13. The semiconductor laser according to claim 5,
in which the semiconductor layer sequence, seen in plan view, is surrounded all around by a casting body, and the casting body is formed from a plastic,
wherein a thickness of the casting body is equal to a thickness of the semiconductor layer sequence together with the growth substrate, with a tolerance of at most 3 µm.

14. The semiconductor laser according to claim 1,
further comprising a contact potting with or from a plastic,
wherein all electrical contact surfaces for the external electrical contacting of the semiconductor laser are surrounded in places or all around by the contact potting when viewed in plan view, and
wherein the contact potting terminates flush with the electrical contact surfaces in the direction away from the active zone.

15. A method by means of which a semiconductor laser according to claim 13 is produced, comprising the steps:
A) Epitaxial growth of the semiconductor layer sequence and production of the p-contact and of the n-contact,
B) Singulation into semiconductor laser chips and application of the semiconductor laser chips to an intermediate carrier,
C) Creating the temporary or permanent casting body which, viewed in a plan view, surrounds the semiconductor laser chips all around and which mechanically connects the semiconductor laser chips to one another,
D) Producing the external electrical contact surfaces, and
E) Singulation to the semiconductor lasers and/or removal of the casting body.

16. The semiconductor laser according to claim 1,
in which the n-contact, in a plan view of the p-conducting region, is formed by at least one strip extending along the resonator path.

* * * * *